(12) United States Patent
Xiong et al.

(10) Patent No.: US 10,504,977 B2
(45) Date of Patent: Dec. 10, 2019

(54) ORGANIC LIGHT-EMITTING CIRCUIT STRUCTURE HAVING TEMPERATURE COMPENSATION FUNCTION

(71) Applicant: Shanghai Tianma AM-OLED Co., Ltd., Shanghai (CN)

(72) Inventors: Zhiyong Xiong, Shanghai (CN); Duzen Peng, Shanghai (CN); Jianjie Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 56 days.

(21) Appl. No.: 15/707,887

(22) Filed: Sep. 18, 2017

(65) Prior Publication Data
US 2018/0006097 A1  Jan. 4, 2018

(30) Foreign Application Priority Data
Feb. 10, 2017  (CN) .......................... 2017 1 0073290

(51) Int. Cl.
*H01L 27/32* (2006.01)
(52) U.S. Cl.
CPC ................................ *H01L 27/3248* (2013.01)
(58) Field of Classification Search
CPC .............. H01L 27/3248; H01L 51/529; G09G 2320/041
USPC ......................................................... 257/40
See application file for complete search history.

(56) References Cited

U.S. PATENT DOCUMENTS

| 2006/0027822 | A1* | 2/2006 | Choi ................... G09G 3/3233 257/94 |
| 2010/0090931 | A1 | 4/2010 | Kawabe |
| 2018/0130414 | A1* | 5/2018 | Hekmatshoartabari ..................... G09G 3/3233 |
| 2018/0374910 | A1* | 12/2018 | Riedel ................. H01L 51/5056 |

FOREIGN PATENT DOCUMENTS

| CN | 101217185 A | 7/2008 | |
| CN | 105679245 A | 6/2016 | |
| DE | 19933735 A1 | 2/2001 | |
| WO | WO 2016059171 A2 * | 4/2016 | ......... H01L 51/5209 |

* cited by examiner

*Primary Examiner* — Raj R Gupta
(74) *Attorney, Agent, or Firm* — Alston & Bird LLP

(57) ABSTRACT

An organic light-emitting circuit structure having a temperature function includes an organic light-emitting diode which has an anode and a cathode opposite to each other; a driving transistor including a first electrode and a second electrode; the first electrode is a source electrode, the second electrode is a drain electrode; or, the first electrode is the drain electrode, the second electrode is the source electrode; a temperature sensitive resistor, which is electrically connected between the driving transistor and the light-emitting device or between the driving transistor and the voltage source. The temperature sensitive resistor increases a resistance value at sensing a temperature increase or decreases the resistance value at sensing a temperature decrease. As a result a current through the organic light-emitting diode stays compensated and stable, thereby ensuring that the organic light-emitting diode keeps emitting light normally under various temperature conditions.

6 Claims, 11 Drawing Sheets without temperature sensitive resistor compensation with temperature sensitive resistor compensation without temperature sensitive resistor compensation

ORGANIC LIGHT-EMITTING CIRCUIT STRUCTURE HAVING TEMPERATURE COMPENSATION FUNCTION

CROSS-REFERENCE TO RELATED APPLICATIONS

This application claims priority to Chinese patent application No. CN201710073290.6, filed on Feb. 10, 2017, and entitled "Organic Light-emitting Circuit Structure Having Temperature Compensation Function", the disclosure of which is incorporated herein by reference in its entirety.

TECHNICAL FIELD

The present disclosure relates to the field of organic light-emitting display, in particular, to an organic light-emitting circuit structure having a temperature compensation function.

BACKGROUND

With the rapid progress of display technology, display devices and semiconductor components used in display have made leap progresses. Organic light-emitting displays are also gradually applied by people's daily use. An active matrix organic light-emitting diode display has advantages such as: wide viewing angle, high response speed, self-luminous, bendable, large operating temperature range, light weight and thinning, etc., meeting characteristic requirements of displays in the multimedia era. Therefore, the active matrix organic light-emitting diode display has a great development potential, and is expected to become the mainstream of the next generation flat panel display.

However, organic light-emitting diode (OLED) is a temperature sensitive device. Compared to a liquid crystal display, the OLED has a wider operating temperature range and can operate in high temperature (up to 85° C.) and low temperature (low to −40° C.) environments. However, OLED changes its electrical characteristics significantly as temperature moves out of typical room temperature range. When temperature changes, an organic light-emitting diode (OLED) varies its voltage-current characteristics accordingly. The manifestations are: when the temperature is higher, the OLED presents a lower resistance characteristic; when the temperature is lower, the OLED presents a higher resistance characteristic. OLED's voltage-current characteristics puts its operation point outside a saturation region where the OLED display is at a pre-established voltage setting, resulting in unstable image display.

SUMMARY

The present disclosure aims to prevent an abnormal OLED display caused by shift of device characteristics in an environment having a changing temperature. The present disclosure provides a circuit structure having a temperature compensation function, which includes:

a light-emitting diode including a cathode and an anode opposite to each other;

a driving transistor including a first electrode and a second electrode; the first electrode is connected with the anode, the second electrode is connected with a voltage source through a power line, the driving transistor is configured to supply a driving current to the light-emitting diode based on the voltage supplied by the voltage source; and a temperature sensitive resistor, electrically connected between the driving transistor and the light-emitting device, or electrically connected between the driving transistor and the voltage source, and configured to increase a resistance value by sensing temperature increasing or decrease the resistance value by sensing temperature decreasing so as to adjust the driving current.

The first electrode is a source electrode, the second electrode is a drain electrode; or, the first electrode is the drain electrode, the second electrode is the source electrode.

According to the present disclosure, the temperature sensitive resistor is added in the circuit, so that a change in the electrical characteristics of the organic light-emitting diode is compensated when temperature changes, the operating points of the organic light-emitting diode and the driving transistor are maintained stable. Therefore it is ensured that the organic light-emitting diode maintains a normal luminance at different environment temperatures.

DETAILED DESCRIPTION

In order to make the foregoing objects, features and advantages of the present disclosure more apparent and understandable, the disclosure will be further described below in conjunction with the accompanying drawings and embodiments.

It should be noted that specific details are set forth in the following description so as to fully understand the disclosure. However, the present disclosure may be embodied in various other manners which are different from that described herein, and those skilled in the art may make similar generalizations without departing from the spirit of the present disclosure. Therefore, the present disclosure is not limited to the specific embodiments disclosed below.

Figure 1:
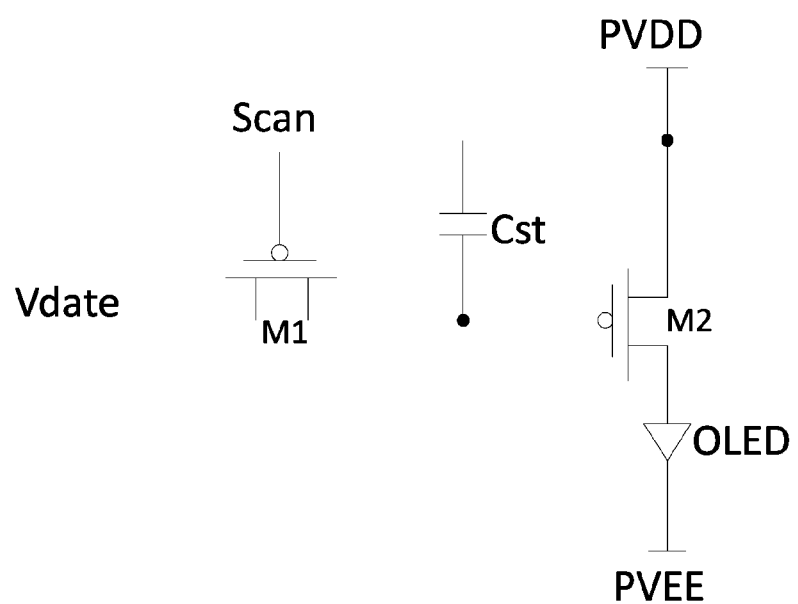
FIG. 1 is a schematic diagram showing an organic light-emitting circuit according to the related art.

FIG. 1 is a schematic diagram showing an organic light-emitting circuit according to the related art. As shown in FIG. 1, a conventional organic light-emitting circuit is composed of a switching thin film transistor (M1), a driving thin film transistor (M2), a storage capacitance (Cst) and an organic light-emitting diode (OLED). In a light-emitting phase of the OLED, when a certain row is scanned by a scan line, the scan line of the row applies a voltage to a gate electrode of the switching TFT (M1), the switching TFT (M1) is turned on, a signal line conveys a data signal, a voltage is applied to a gate electrode of the driving TFT (M2) via the switching TFT (M1), the driving TFT (M2) is driven to be turned on, a power line applies a constant voltage, a current flows through the OLED, causes the OLED to emit light, and ensures that a pixel is in a light state. Meanwhile, the storage capacitance (Cst) is charged by the voltage provided by the signal line, and the signal is stored in the storage capacitance.

Figure 2:
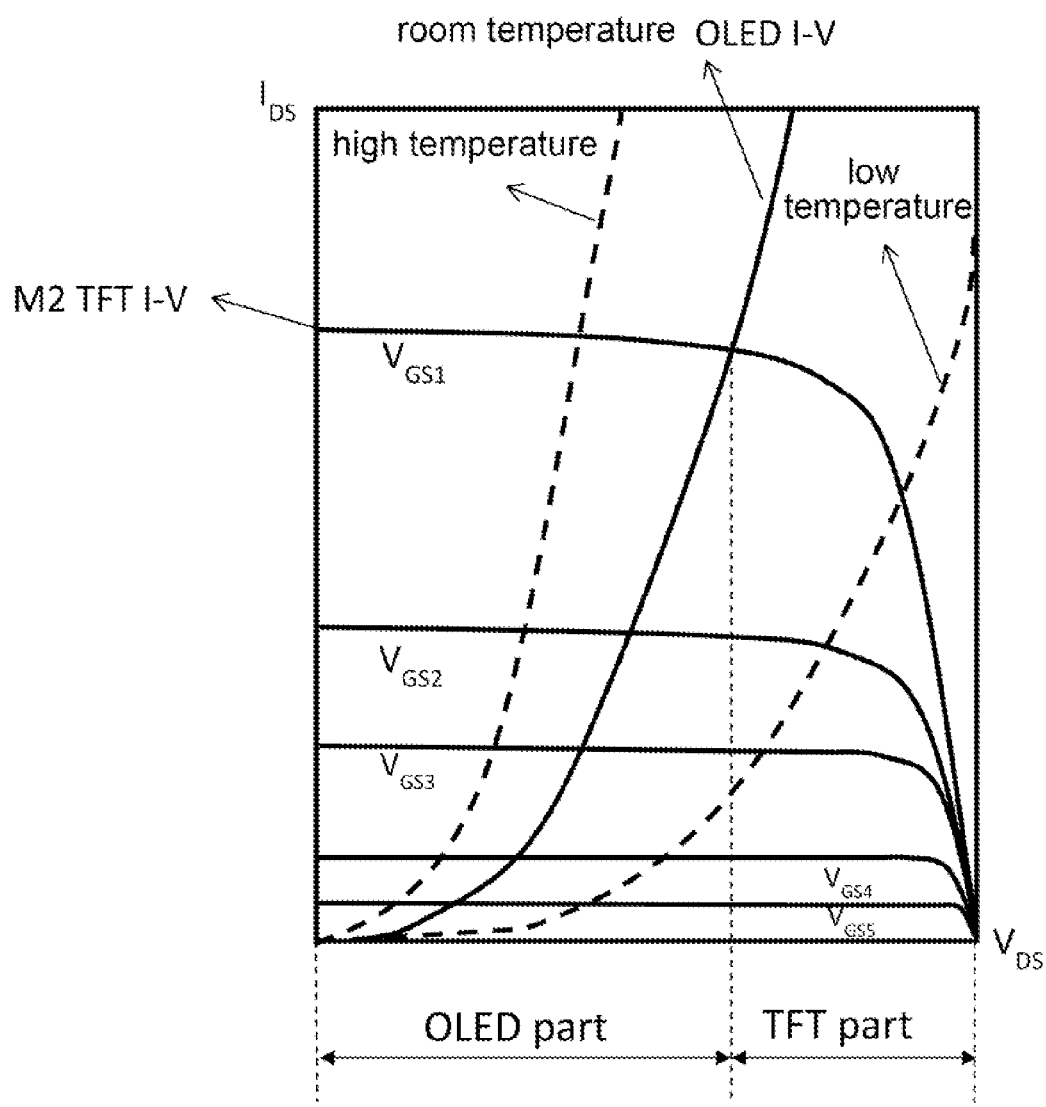
FIG. 2 is a schematic diagram showing output characteristics of a driving thin film transistor M2 and voltage-current characteristics of an organic light-emitting diode in the organic light-emitting circuit in FIG. 1.

FIG. 2 is a schematic diagram showing output characteristics of a driving thin film transistor M2 and voltage-current characteristics of an organic light-emitting diode in the organic light-emitting circuit in FIG. 1. As shown in FIG. 2, the constant voltage PVEE–PVDD is provided by the power line, the driving TFT (M2) is operated in a saturation region, and a current $I_{DS}$ flowing through the driving TFT (M2) hardly varies with a drain voltage of the driving TFT (M2), and the current $I_{DS}$ is controlled by a gate voltage. Therefore, the luminance of the OLED is adjusted by the gate-source voltage ($V_{GS}$) of the driving TFT (M2).

The voltage PVEE–PVDD includes two parts: a voltage $V_{DS}$ across the driving TFT (M2) and a voltage $V_{OLED}$ across the OLED. Generally, it is required to meet in the normal operating condition that the voltage PVEE–PVDD is greater than the sum of a normal gray-scale operating voltage of the OLED and a normal operating voltage of the driving TFT (M2) (that is, the operating point enters the saturation region). If the voltage PVEE–PVDD is less than $V_{DS}+V_{OLED}$, the display is abnormal. If the voltage PVEE–PVDD is too large, the power consumption is enormous. Therefore, the voltage PVEE–PVDD is related to device characteristics.

However, OLED is a temperature-sensitive device. The OLED can operate in environments with temperature as high as 85° C. and as low as –40° C., however, at those abnormal temperatures, the electrical characteristics of the OLED changes significantly, causing that an operation characteristics of the pixel circuit where the OLED is located is also changed. Injection efficiencies of electrons or holes in the light-emitting unit of the OLED are affected by temperature. As shown by dotted lines in FIG. 2, temperature influence on the voltage-current characteristics of an organic light-emitting diode shows as: with the increase of temperature, the effective resistance of the OLED decreases, its forward characteristic curve is shifted to the left and the voltage across the OLED decreases, the $V_{DS}$ and the driving current of the TFT increases, resulting in increased OLED current $I_{OLED}$; on the other hand, when external temperature decreases, the voltage across the OLED increases and the OLED current $I_{OLED}$ decreases, thereby affecting the luminance of the OLED and leading to a display abnormality.

In view of above problems, the present OLED circuit avoids the display abnormality caused by the OLED device characteristics shift in a temperature-changing environment. The change in voltage-current characteristics of the organic light-emitting diode is compensated when the temperature changes, the operating result of the OLED is not affected by the temperature change in the case that the voltage PVEE–PVDD is substantially maintained constant, and the $I_{OLED}$ is maintained stable.

Figure 3:
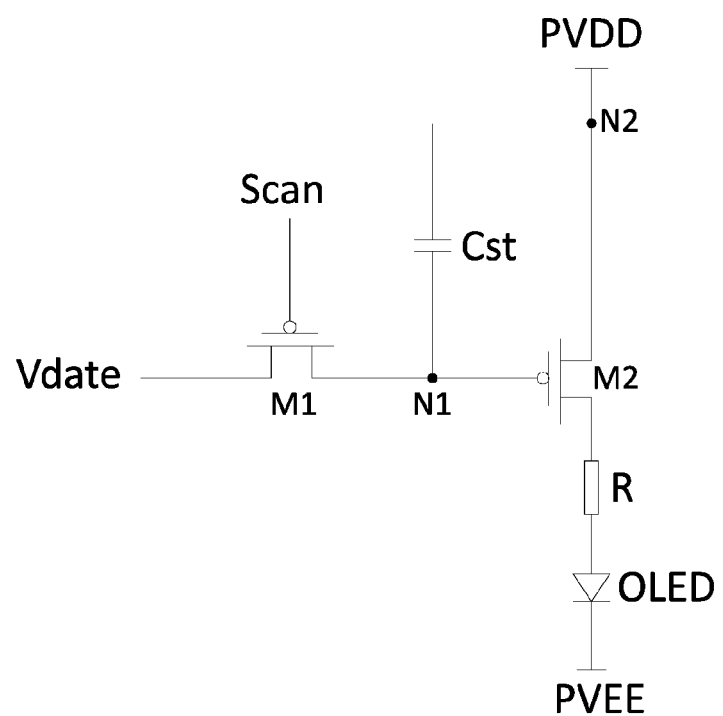
FIG. 3 is a schematic diagram showing an organic light-emitting circuit with a temperature function according to one embodiment.

FIG. 3 is a schematic diagram showing an organic light-emitting circuit having a temperature compensation function according to the present disclosure. Since the organic light-emitting diode (OLED) is a current device, a driving TFT (M2) is required. In the present embodiment, the driving TFT is a P-channel driving TFT. The driving TFT (M2) and the OLED device are connected in series, that is, the current of the driving TFT (M2) is the current of the OLED when the OLED is operating. The function of the switching TFT (M1) is to send the data line voltage to node N1 by means of the control of the scan line, and the driving TFT (M2) is driven to operate by the voltage difference between the node N1 and node N2. The voltage of N1 can be stored at the capacitor (Cst) temporarily so as to maintain the potential of the node N1 constant until switching to a next frame of image.

A temperature sensitive resistor R is connected between the driving TFT (M2) and the OLED. The temperature sensitive resistor R is a resistor with positive temperature coefficient, that is, the resistance value of the temperature sensitive resistor R increases with increasing temperature. As temperature increases, the effective resistance of the OLED decreases, the forward characteristic curve is shifted to the left, the voltage across the OLED decreases. The resistance value of the temperature sensitive resistor R increases with increasing temperature, the voltage across the temperature sensitive resistor R increases. In the case that the total voltage between PVEE and PVDD is maintained substantially constant, the decreased voltage cross the OLED is compensated by the temperature sensitive resistor R, as a result, the OLED is at the normal operating point. As temperature decreases, the effective resistance of the OLED increases, its forward characteristics curve is shifted to the right, the voltage across the OLED increases. The resistance value of the temperature sensitive resistor R decreases, the voltage across the temperature sensitive resistor R decreases. In summary, the change in voltage-current characteristics of the temperature sensitive resistor R and the change in voltage-current characteristics of the OLED are made complementary to each other. As a result, in the case that the total voltage between PVEE and PVDD is maintained substantially constant, the operating point of the OLED stays always in the saturation region, thereby OLED luminance is kept constant and display abnormality is avoided.

Figure 4:
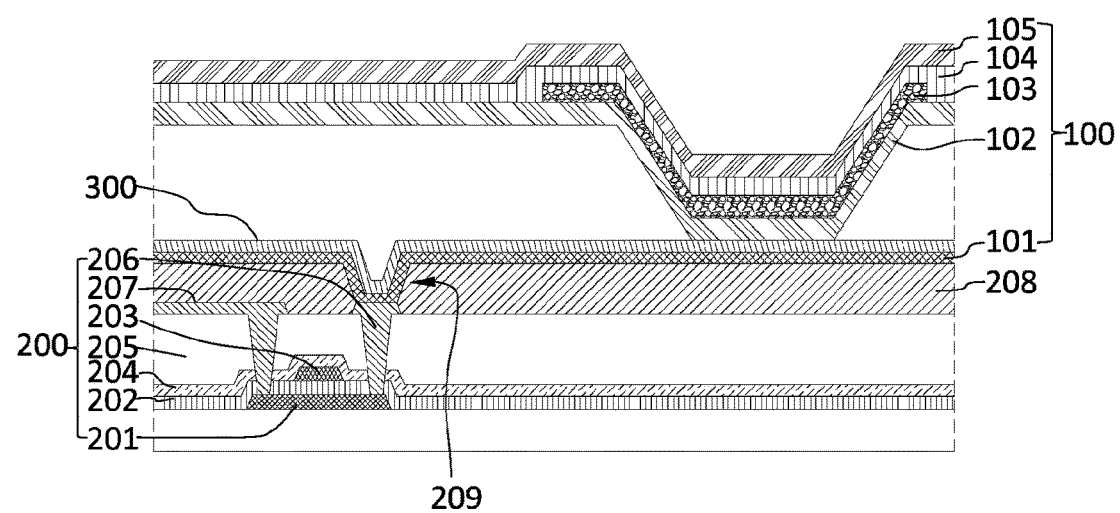
FIG. 4 is a cross sectional diagram showing a pixel structure of the organic light-emitting circuit having a temperature function according to one embodiment.

FIG. 4 is a cross sectional diagram showing a pixel structure of an organic light-emitting circuit having a temperature function according to one embodiment of the present disclosure.

The pixel structure in the present embodiment includes an organic light-emitting diode 100, a driving diode 200 and a temperature sensitive resistor 300.

The organic light-emitting diode 100 includes: an anode 101 and a cathode 105, an organic light-emitting layer 103 between the anode 101 and the cathode 105, an electron injection layer 104 between the organic light-emitting layer 103 and the cathode 105, and a hole injection layer 102 between the organic light-emitting layer 103 and the anode 101. The organic light-emitting diode 100 further includes an electron transport layer (not shown in the Figure)

between the electron injection layer 104 and the organic light-emitting layer 103 and a hole transport layer (not shown in the Figure) between the hole injection layer 102 and the organic light-emitting layer 103.

The driving transistor 200 includes a semiconductor layer 201, a first gate insulation layer 202 formed on the semiconductor layer 201, a gate electrode 203 formed on the first gate insulation layer 202 and overlapping the semiconductor layer 201, a second gate insulation layer 204 formed on the gate electrode 203, an interlayer insulation layer 205 formed on the second gate insulation layer 204, a first electrode 206 and a second electrode 207 formed on the interlayer insulation layer 205 and connected with the semiconductor layer 201. The first electrode 206 and the second electrode 207 are spaced apart from each other. The first electrode 206 is connected with the anode 101 of the organic light-emitting diode 100, and the second electrode 207 is connected with the power source PVDD via a power line.

In the present embodiment, a channel of the semiconductor layer 201 of the driving transistor 200 is a channel doped with P type impurities. The first electrode 206 is a drain electrode of the driving transistor, and the second electrode 207 is a source electrode of the driving transistor.

However, the present disclosure is not limited to this. For example, the channel of the semiconductor layer of the driving transistor may be a channel doped with N type impurities. The first electrode is the source electrode of the driving transistor, and the second electrode is the drain electrode of the driving transistor, when the channel of the semiconductor layer 201 of the driving transistor 200 may is a channel doped with N type impurities.

A planarization layer 208 is provided between the driving transistor 200 and the organic light-emitting diode 100. The anode 101 of the light-emitting diode 100 is connected with the first electrode 206 of the driving transistor 200 through a via hole 209 of the planarization layer 208.

A temperature sensitive resistor 300 is disposed between the hole injection layer 102 and the anode 101 of the organic light-emitting diode 100. That is, the hole injection layer 102 and the anode 101 of the organic light-emitting diode 100 are connected by the temperature sensitive resistor 300.

In an embodiment, the temperature sensitive resistor 300 includes $BaTiO_3$ material doped with $Sb_2O_3$ and $Al_2O_3$.

In an embodiment, the temperature sensitive resistor 300 is a resistive layer coving the anode 101 of the organic light-emitting diode 100. A pattern of the temperature sensitive resistor 300 is in accordance with a pattern of the anode 101 of the organic light-emitting diode 100. That is, the regular pattern of the anode 101 is maintained constant, the temperature sensitive resistor 300 whose pattern is in accordance with the pattern of the anode 101 is directly formed on the anode 101 after the fabrication of the anode 101 is completed, so that the temperature sensitive resistor 300 exactly fully covers the anode 101, and then subsequent processes are performed. The temperature sensitive resistor fully covers the anode of the organic light-emitting diode in the form of resistive layer, the process is more simpler and easier to implement, the resistive layer and the anode may be patterned by sharing a same mask, and the cost is saved.

As below, table 1-1 and table 1-2 are the comparison of simulation data of the organic light-emitting circuit in FIG. 1 and simulation data of the organic light-emitting circuit of the present disclosure in FIG. 3. Herein, PVDD=4.6 V (Volt); PVEE=−3.9 V; Vdata=1 V; Cst=0.24 pf (picofarad); and Vth=−1.5V.

TABLE 1-1 current flowing through the OLED of the circuit in FIG. 1 under various temperature conditions

| | Resistance of the OLED (without temperature sensitive resistor) | Current $I_{OLED}$ (nA) |
|---|---|---|
| high temperature | $1*10^7\ \Omega$ | 135.20 |
| room temperature | $2*10^7\ \Omega$ | 132 |
| low temperature | $3*10^7\ \Omega$ | 129.4 |

TABLE 1-2 current flowing through the OLED of the circuit in FIG. 3 under various temperature conditions

| | Resistance of the OLED | temperature sensitive resistor | Current $I_{OLED}$ (nA) |
|---|---|---|---|
| high temperature | $1*10^7\ \Omega$ | $2.6*10^7\ \Omega$ | 135.20 |
| room temperature | $2*10^7\ \Omega$ | $1.4*10^7\ \Omega$ | 132 |
| low temperature | $3*10^7\ \Omega$ | $5*10^6\ \Omega$ | 129.4 |

It can be seen from the above simulation data that the current $I_{OLED}$ flowing through the OLED in the organic light-emitting circuit in FIG. 1 under the high temperature condition is 152.2 nA, while the $I_{OLED}$ is 129.4 nA under the low temperature condition, and the difference between the current flowing through the OLED under the high temperature condition and that under the low temperature condition is greater than 5 nA. However, the difference between the current flowing through the OLED of the organic light-emitting circuit according to the present disclosure under the high temperature condition and that under the low temperature condition is less than 0.5 nA.

Figure 5:
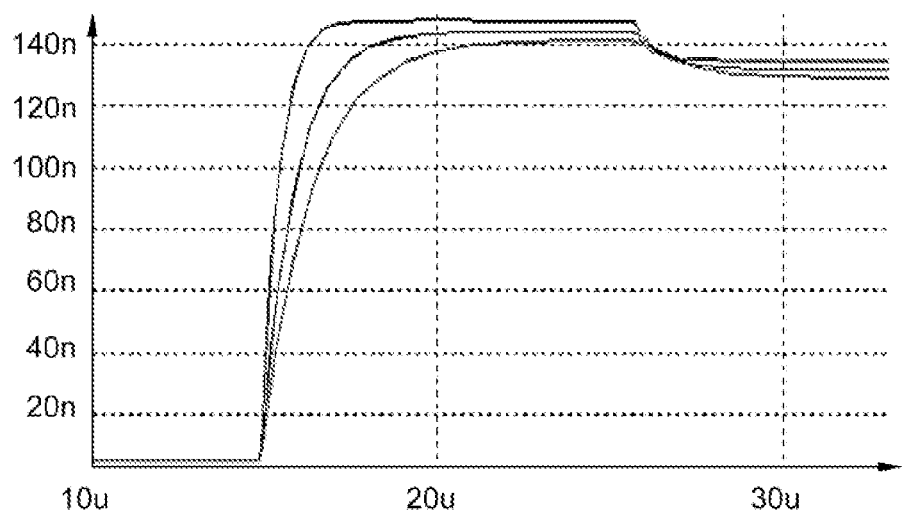
FIG. 5 is a diagram showing the comparison of the simulated IV response of the organic light-emitting circuit in FIG. 1 with the simulated IV response of the organic light-emitting circuit of another embodiment in FIG. 3.
Figure 5:
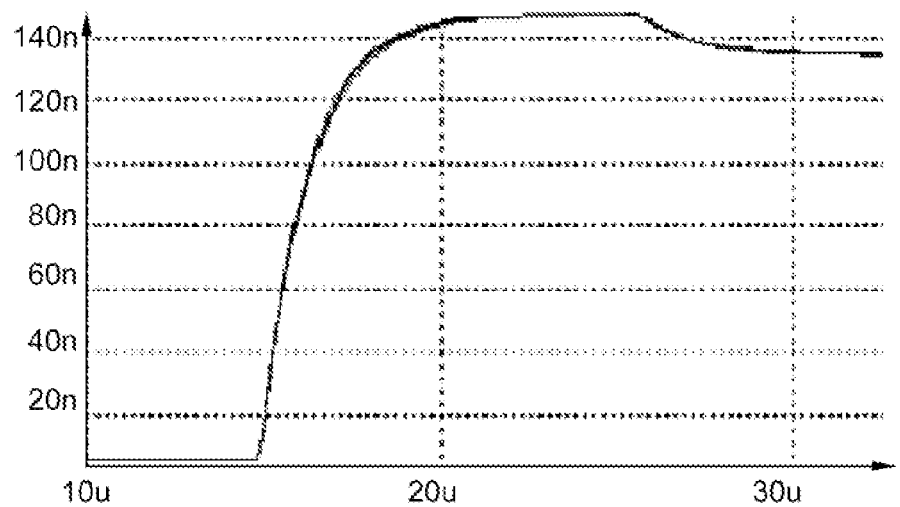

FIG. 5 is a diagram comparing the simulation of the organic light-emitting circuit in FIG. 1 with the simulation of the organic light-emitting circuit of the present disclosure in FIG. 3. As shown in FIG. 5, three curves in each curve diagram represent current waves of the organic light-emitting diode under three conditions of different temperatures (high temperature, room temperature, low temperature), respectively. The abscissa is time in microsecond (us), and the ordinate is current in nanoampere (nA). It can be seen from FIG. 5 that the current waves of the organic light-emitting diode of the circuit without temperature sensitive resistor compensation are of significant differences under different temperature conditions, while current waves of the organic light-emitting diode of the circuit with temperature sensitive resistor are of very little differences under different temperature conditions. Therefore, the compensation circuit according to the present disclosure can make the OLED device obtain a stable current under different temperature conditions and maintain the normal light-emitting.

Figure 6:
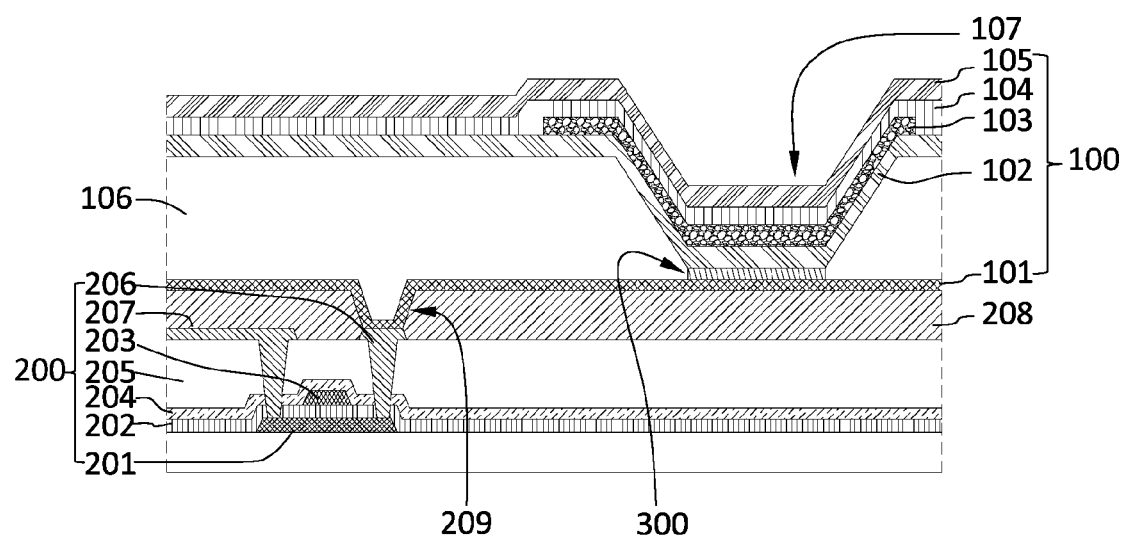
FIG. 6 is a cross sectional diagram showing another pixel structure of the organic light-emitting circuit having a temperature function according to another embodiment.

FIG. 6 is a cross sectional diagram showing another pixel structure of the organic light-emitting circuit having a temperature function according to another embodiment of the present disclosure. As shown in FIG. 6, the organic light-emitting diode 100 includes a anode 101 and a cathode 105, an organic light-emitting layer 103 between the anode 101 and the cathode 105, an electron injection layer 104 between the organic light-emitting layer 103 and the cathode 105, and a hole injection layer 102 between the organic light-emitting layer 103 and the anode 101. The organic light-emitting diode 100 further includes an electron transport layer (not shown in the Figure) between the electron injection layer 104 and the organic light-emitting layer 103 and a hole transport layer (not shown in the Figure) between the hole injection layer 102 and the organic light-emitting layer 103.

A pixel define layer 106 is formed between a planarization layer 208 and the anode 101 of the organic light-emitting diode 100. The pixel define layer 106 is provided with display opening area 107 exposing the anode 101. The hole injection layer 102 is brought into contact with the anode 101 through the display opening area 107 of the pixel define layer 106.

A temperature sensitive resistor 300 is disposed between the hole injection layer 102 and the anode 101 of the organic light-emitting diode 100. That is, the hole injection layer 102 and the anode 101 of the organic light-emitting diode 100 are connected by the temperature sensitive resistor 300. Other similarities between the present embodiment and the pixel structure provided by the previous embodiment are not described herein.

Differences are: the pattern of the temperature sensitive resistor 300 of the present embodiment is in accordance with the pattern of the display opening area 107. That is, the regular pattern of the anode 101 is maintained constant, the temperature sensitive resistor 300 whose pattern is in accordance with the display opening area 107 is directly formed on the anode 101 after the fabrication of the anode 101 is completed, so that the upper face of the resistive layer of the temperature sensitive resistor 300 is in exact and full contact with the hole injection layer 102 of the display opening area 107, and then subsequent processes are performed. The patterning design that the temperature sensitive resistor corresponds to the display opening area limits the coverage area of the resistive layer, so that the resistive layer is more easier to control, the interference of the resistive layer on other areas is avoided, and the presence of bad problem is reduced.

Figure 7:
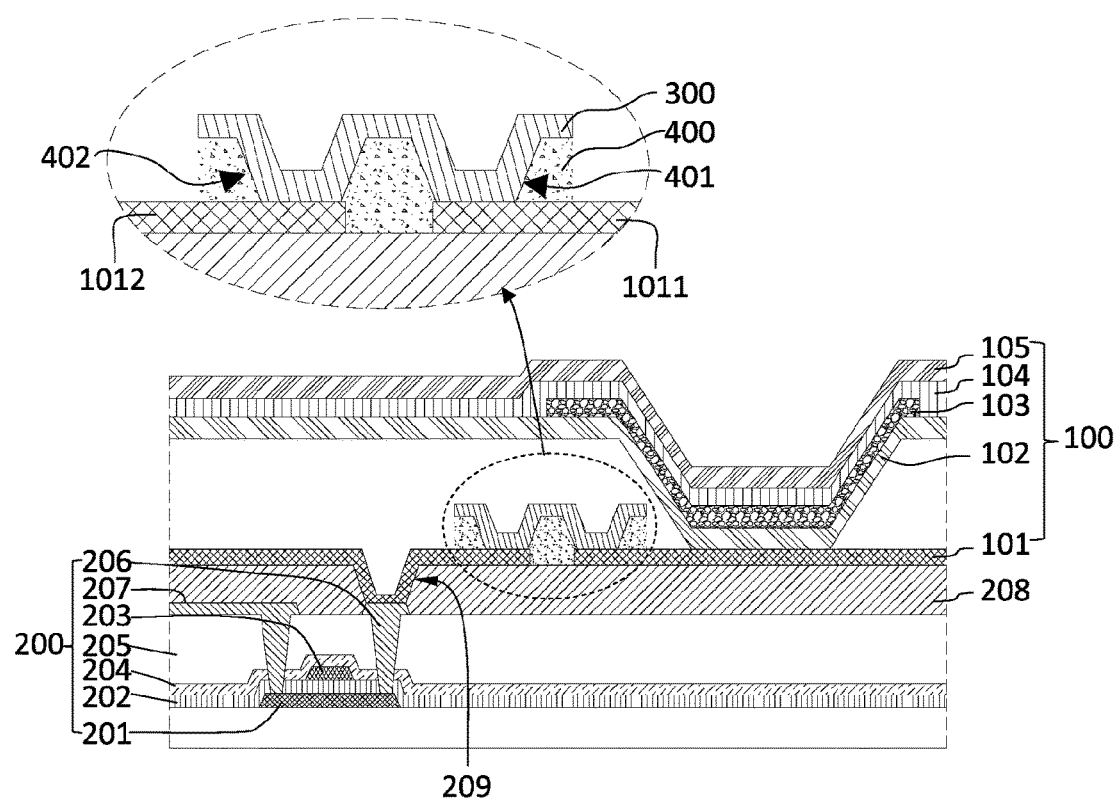
FIG. 7 is a cross sectional diagram showing still another pixel structure of the organic light-emitting circuit having a temperature function according to another embodiment.

FIG. 7 is a cross sectional diagram showing still another pixel structure of the organic light-emitting circuit having a temperature function according to another embodiment of the present disclosure. As shown in FIG. 7, other similarities between the present embodiment and the pixel structure provided by the previous embodiment are not described herein.

The temperature sensitive resistor 300 is disposed between the hole injection layer 102 and the anode 101 of the organic light-emitting diode 100. That is, the hole injection layer 102 and the anode 101 of the organic light-emitting diode 100 are connected by the temperature sensitive resistor 300.

Differences of the two embodiments are: the anode 101 of the organic light-emitting diode 100 includes a first branch 1011 and a second branch 1012 disconnected from each other. The first branch 1011 is connected with the hole injection layer 102 of the organic light-emitting diode 100, and the second branch 1012 is connected with the first electrode 206 of the driving transistor 200. Both the first branch 1011 and the second branch 1012 of the anode 101 are covered an insulation layer 400. The insulation layer 400 also covers the disconnection position of the first branch 1011 and the second branch 1012. An area, which covers the first branch 1011, of the insulation layer 400 is provided with a first opening area 401, and an area, which covers the second branch 1012, of the insulation layer 400 is provided with a second opening area 402.

The temperature sensitive resistor 300 is a resistive layer covering the insulation layer 400. The temperature sensitive resistor 300 is electrically connected with the first branch 1011 of the anode 101 through the first opening area 401, and is electrically connected with the second branch 1012 of the anode 101 through the second opening area 402. In this way, the first branch 1011 and the second branch 1012 are electrically connected through the temperature sensitive resistor 300.

In the present embodiment, the anode is disconnected, then the anode is covered by the insulation layer, the temperature sensitive resistor is connected with the two branches of the anode underneath through opening areas (or via holes) of the insulation layer, thereby realizing the conduction of the two branches of the anode. Etching is required during patterning the temperature sensitive resistor layer, the anode underneath will also be etched if there is no insulation layer. The temperature sensitive resistor is connected with the anode through via holes of the insulation layer rather than is directly formed on the anode, therefore, the process effect is ensured when patterning the temperature sensitive resistor layer, and the occurrence of bad problems are prevented.

Figure 8:
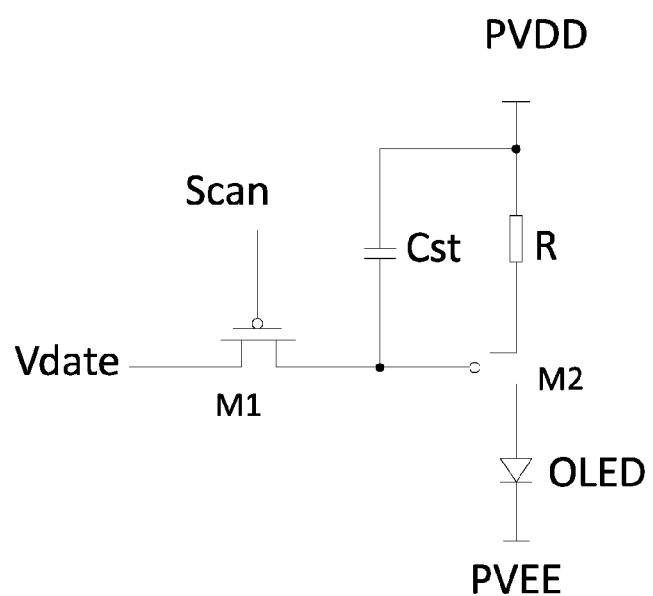
FIG. 8 is a schematic diagram showing another organic light-emitting circuit having a temperature function according to another embodiment.
Figure 9:
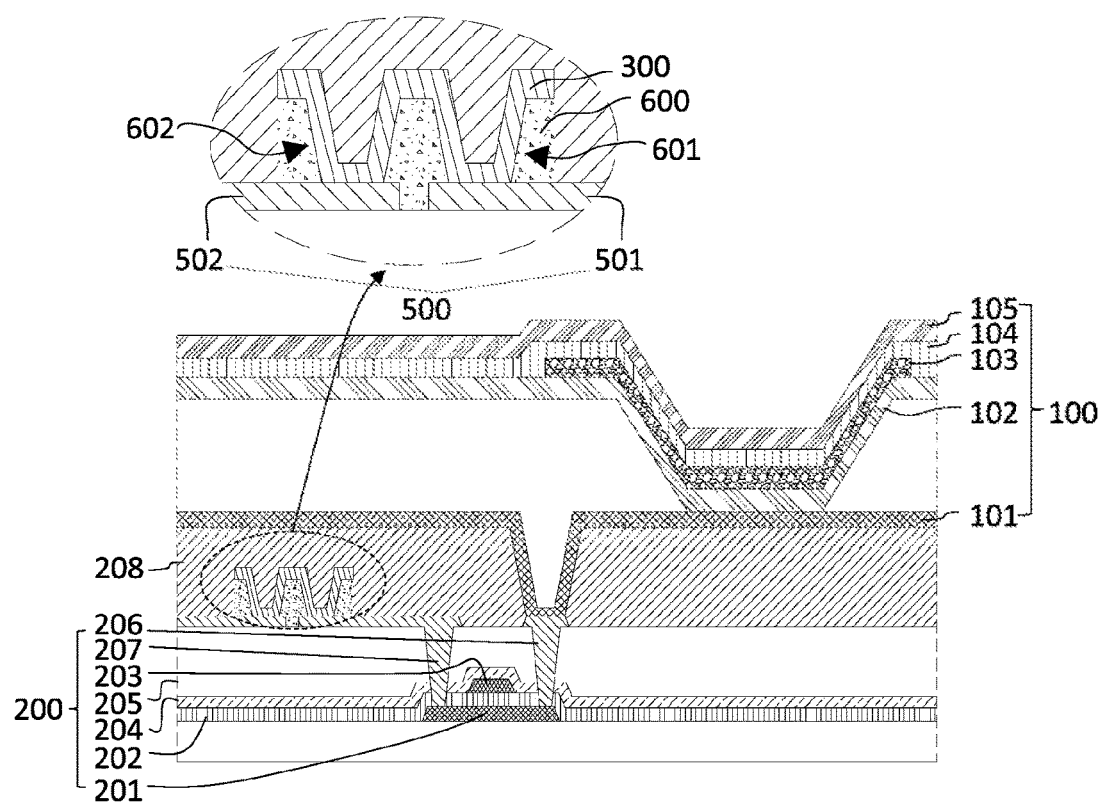
FIG. 9 is a cross sectional diagram showing yet another pixel structure of the organic light-emitting circuit having a temperature function according to another embodiment.

FIG. 8 is a schematic circuit diagram showing another organic light-emitting circuit having a temperature function according to another embodiment of the present disclosure. FIG. 9 is a cross sectional diagram showing the cross section of the pixel structure of the device in FIG. 8. Other similarities between the present embodiment and the pixel structure provided by the previous embodiment are not described herein.

Differences of the above embodiments are: in the present embodiment, the temperature sensitive resistor R is connected in series between the driving transistor driving TFT (M2) and the power source PVDD.

As shown in FIG. 9, the driving transistor 200 includes a semiconductor layer 201, a first insulation layer 202 formed on the semiconductor layer 201, a gate electrode 203 formed on the first gate insulation layer 202 and overlapping the semiconductor layer 201, a second gate insulation layer 204 formed on the gate electrode 203, an interlayer insulation layer 205 formed on the second gate insulation layer 204, a first electrode 206 and a second electrode 207 formed on the interlayer insulation layer 205. The first electrode 206 and the second electrode 207 are spaced apart from each other.

The first electrode 206 of the driving transistor 200 is connected with the anode 101 of the organic light-emitting diode 100. The second electrode 207 of the driving transistor 200 is connected with the power line 500 via the temperature sensitive resistor 300, and connected with the voltage source PVDD via the power line 500.

An end of the power line 500 closing to the second electrode 207 of the driving transistor 200 includes a third branch 501 and a fourth branch 502 which are disconnected with each other. The third branch 501 is electrically connected with the second electrode 207 of the driving transistor 200. The fourth branch 502 is electrically connected with the power source PVDD.

Both of the third branch 501 and the fourth branch 502 of the power line 500 are covered by an insulation layer 600. The insulation layer 600 covers the disconnection area between the third branch 501 and the fourth branch 502 after being patterned. An area, covering the third branch 501, of the insulation layer 600 is provided with a third opening area 601. An area, covering the fourth branch 502, of the insulation layer 600 is provided with a fourth opening area 602.

The temperature sensitive resistor 300 is a resistive layer covering the insulation layer 600. The temperature sensitive resistor 300 is electrically connected with third branch 501 of the power line 500 via the third opening area 601, and is electrically connected with the fourth branch 502 of the power line 500 via the fourth opening area 602. In this way, the third branch 501 and the fourth branch 502 are electrically connected by the temperature sensitive resistor 300.

The temperature sensitive resistor layer is connected with the power line through the opening areas (or via holes) of the insulation layer rather than directly formed on the power line, the power line is prevented from being partially etched during etching the temperature sensitive resistor layer, the process effect is ensured, and the occurrence of bad problems are prevented.

In the present embodiment, the temperature sensitive resistor is connected in series between the driving transistor driving TFT (M2) and the voltage source PVDD in such a way that an area on an end of the power line closing to the source electrode is disconnected into two branches, and two disconnections are electrically connected through the temperature sensitive resistor. However, the present disclosure is not limited to this. Alternatively, the power line and the second electrode of the driving transistor are electrically connected by the temperature sensitive resistor. Further, an area where the power line and the second electrode of the driving transistor are disconnected is provided with an insulation layer, areas, covering the power line and the second electrode of the driving transistor, of the insulation layer are provided opening areas, respectively. The temperature sensitive resistor is electrically connected with the power line and the second electrode through the opening areas.

Figure 10:
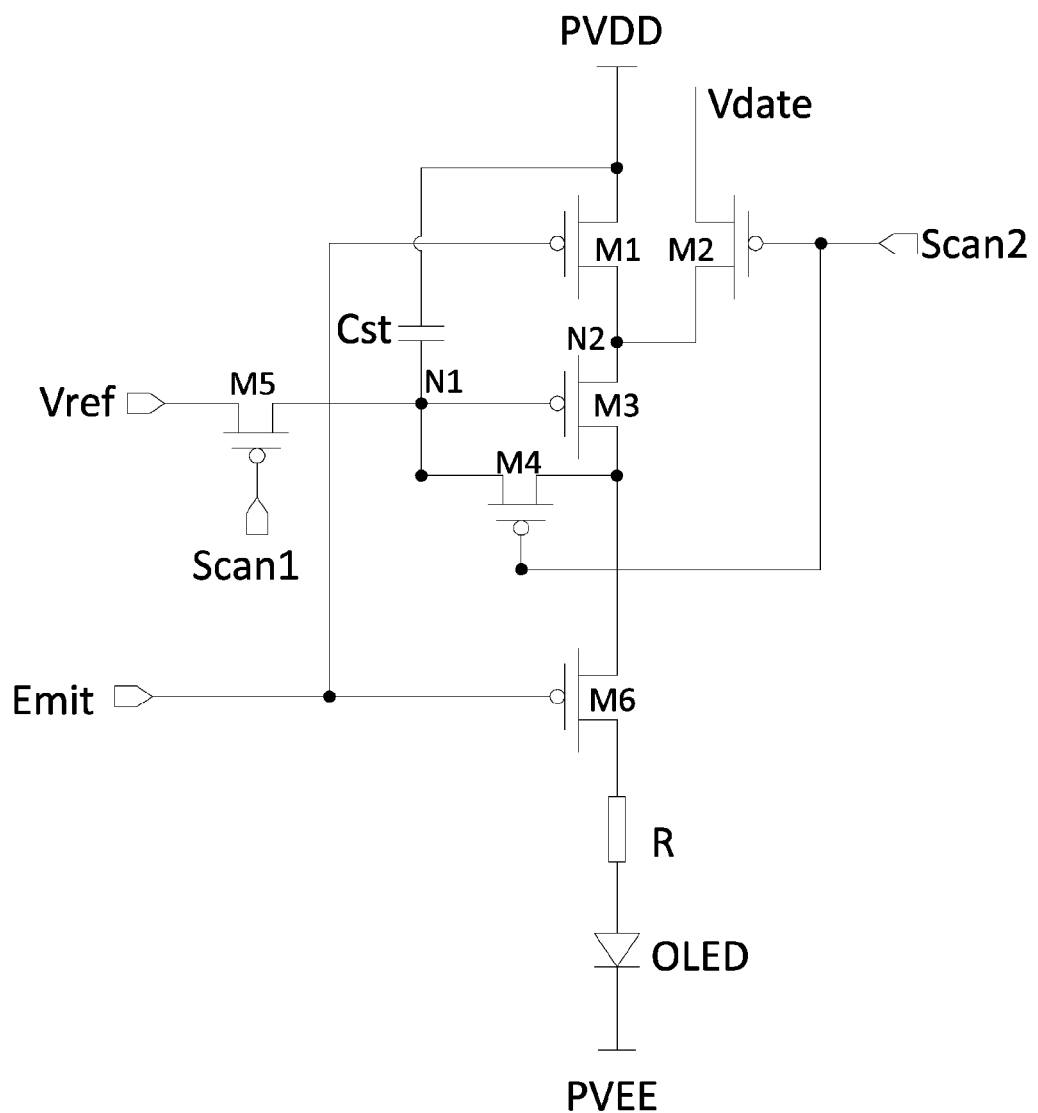
FIG. 10 is a schematic diagram showing still another organic light-emitting circuit with a temperature function according to another embodiment.

FIG. 10 is a schematic diagram showing still another organic light-emitting circuit with a temperature function according to one embodiment of the present disclosure. As shown in FIG. 10, the organic light-emitting circuit includes transistors M1, M2, M3, M4, M5 and M6, a capacitor Cst, a temperature sensitive resistor R, and an organic light-emitting diode OLED. The temperature sensitive resistor R is connected in series between M6 and OLED.

In a first phase, a signal "Scan1" is at low potential, a signal "Scan2" and a signal "Emit" are at high potential. M5 is turned on by the signal "Scan1" of low potential. M2, M4 and M1, M6 are turned off by the signal "Scan2" and the signal "Emit" of high potential. Since M5 is turned on, the potential of node N1 is reduced to Vref.

In a second phase, the signal "Scan1" is at high potential, the signal "Emit" is still at high potential, and M5, M1 and M6 are turned off. The signal "Scan2" is changed from high potential to low potential, so that M2 and M4 are turned on. Meanwhile, the capacitor Cst is charged by Vdata through M2, M3 and M4, so that the potential of the node N1 increases until $V_{N1}-V_{N2}=V_{th}$ ($V_{N1}$ denotes the potential of node N1, $V_{N2}$ denotes to potential of node N2, and $V_{th}$ denotes the threshold voltage of M3), and the potential $V_{N1}$ of the node N1 is no longer changed.

In a third phase, the potential of the signal "Emit" is changed from high potential to low potential, so that M1 and M6 are turned on; while the signal "Scan1" and the signal "Scan2" are at high potential, so that M5, M2 and M4 are turned off. Meanwhile, a current flows into the organic light-emitting diode OLED through M1, M3, M6 and the temperature sensitive resistor R under an electric filed between PVDD and PVEE. The temperature sensitive resistor R is a thermal sensitive resistor of a positive temperature coefficient, that is, the resistance value of the temperature sensitive resistor R increase with the increase of temperature. With the increase of temperature, the equivalent resistance of the OLED decreases, while the resistance value of the temperature sensitive resistor R, the change in voltage-current characteristic of the temperature sensitive resistor R and the change in voltage-current characteristic of the OLED can be complementary, so that the OLED is maintained at a normal operating point and $I_{OLED}$ is maintained constant in the case that the total cross voltage PVEE−PVDD is substantially maintained constant, thereby making the luminance of the OLED stable. On the contrary, with the decrease of temperature, the equivalent resistance of the OLED increases, while the resistance of the temperature sensitive resistor R decreases, the change in voltage-current characteristic of the temperature sensitive resistor R and the change in voltage-current characteristic of the OLED can be complementary, so that the OLED is maintained at a normal operating point in the case that the total cross voltage PVEE−PVDD is substantially maintained constant, thereby maintaining the luminance of the OLED and avoiding display abnormality.

Figure 11:
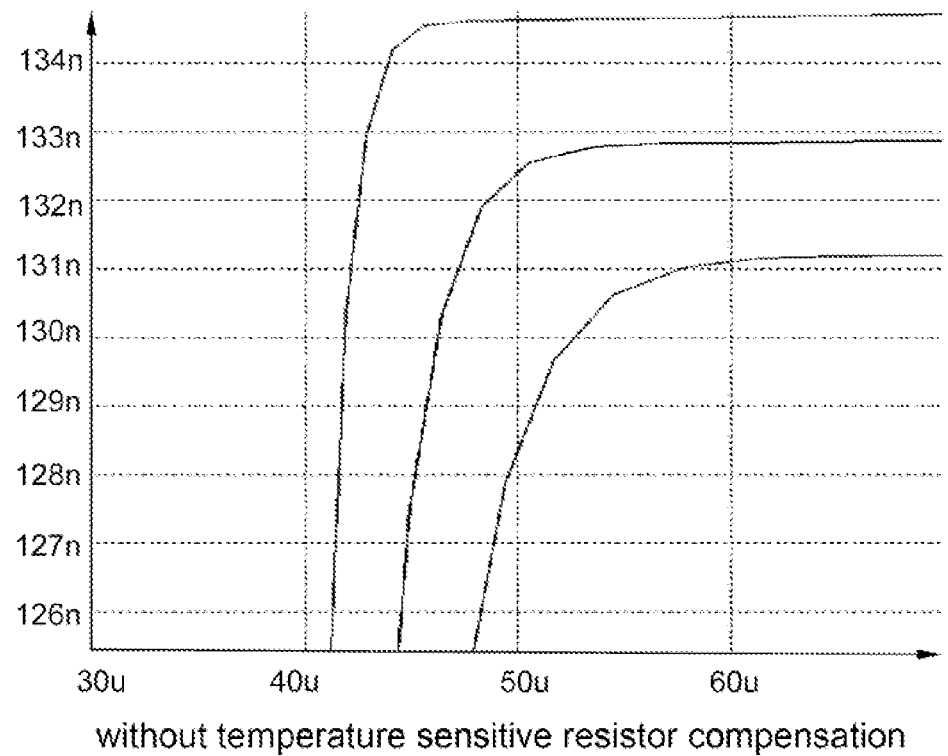
FIG. 11 is a diagram showing the comparison of the simulated response of a conventional 6T1C organic light-emitting circuit with the simulated response of the organic light-emitting circuit of another embodiment in FIG. 10.
Figure 11:
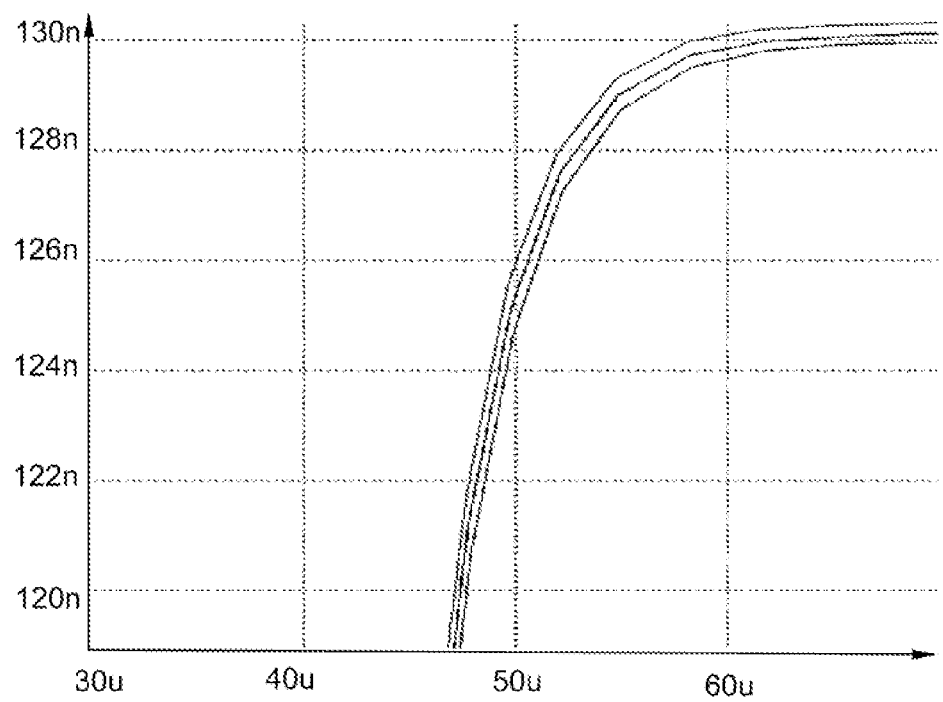

FIG. 11 shows two diagrams comparing the simulation of a conventional 6T1C organic light-emitting circuit (top) with the simulation of the organic light-emitting circuit of the present disclosure (bottom) in FIG. 10. As shown in FIG. 11, three curves in each curve diagram represent current waves of the organic light-emitting diode under three conditions of different temperatures (high temperature, room temperature, low temperature), respectively. The abscissa is time in microsecond (us), and the ordinate is current in nanoampere (nA). It can be seen from FIG. 11 that the current waves of the organic light-emitting diode of the circuit without temperature sensitive resistor compensation are of significant differences under different temperature conditions, while current waves of the organic light-emitting diode of the circuit with temperature sensitive resistor are of very little differences under different temperature conditions. Therefore, the compensation circuit according to the present disclosure can make the OLED device obtain a stable current under different temperature conditions and maintain the normal light-emitting.

It is worth noting that the location of the temperature sensitive resistor R is not limited to between M6 and OLED as shown in FIG. 9. The temperature sensitive resistor R may be disposed at any location of the current path of PVD, M1, M3, M6, the organic light-emitting diode and PVEE. For example, the temperature sensitive resistor R may be disposed between transistor M1 and the inputting terminal of PVDD. Alternatively, the temperature sensitive resistor R may be disposed between the transistor M1 and the transistor M3. Alternatively, the temperature sensitive resistor R may be disposed between the transistor M3 and the transistor M6. Alternatively, the temperature sensitive resistor R may be disposed between the transistor M6 and the inputting terminal of PVEE.

In the above embodiments, the temperature sensitive resistor R is thermal sensitive with a positive temperature coefficient, that is, the resistance value of the temperature sensitive resistor R increases with increasing temperature. The temperature sensitive resistor may include material such as $BaTiO_3$, the specific "temperature-resistance" relationship curve is adjusted by dopants of $Sb_2O_3$, $Al_2O_3$ and the like, however, the present disclosure is not limited to this. The temperature sensitive resistor of the present disclosure also includes other semiconductor material and organic semiconductor material which can realize similar functions.

It should be noted that the present disclosure is not limited to organic light-emitting circuits provided by above embodiments. Any organic light-emitting circuit including a temperature sensitive resistor connected among PVDD, organic light-emitting diode OLED and PVEE falls into the protection scope of the present disclosure.

The foregoing is a further detailed description of the present disclosure in connection with specific preferred embodiments, and it is not to determine that the specific implementation of the disclosure is limited to these descriptions. It will be apparent that several simple deductions or substitutions may be made by those skilled in the art without departing from the spirit of the present disclosure, and should be considered as falling within the protection scope of the present disclosure.

What is claimed is:

1. An organic light-emitting circuit structure having a temperature compensation function, comprising:
    an organic light-emitting diode comprising an anode and a cathode opposite to each other;
    a driving transistor comprising a first electrode and a second electrode, wherein the first electrode is connected with the anode, the second electrode is connected to a voltage source via a power line, the driving transistor is configured to supply a driving current to the organic light-emitting diode based on voltage provided by the voltage source; and
    a temperature sensitive resistor, wherein the temperature sensitive resistor increases a resistance value at sensing a temperature increase or decreases the resistance value at sensing a temperature decrease, wherein a current through the organic light-emitting diode stays compensated and stable; and wherein the first electrode is a source electrode, the second electrode is a drain electrode, or, the first electrode is the drain electrode, the second electrode is the source electrode; and
    wherein the power line and the second electrode are electrically connected by the temperature sensitive resistor.

2. The circuit structure according to claim 1, wherein a planarization layer is provided between the driving transistor and the organic light-emitting diode, the anode and the first electrode are connected through a via hole of the planarization layer.

3. The circuit structure according to claim 1, wherein an insulation layer is provided between the temperature sensitive resistor and the power line and the second electrode, wherein the insulation layer covers at least a part of the power line and at least a part of the second electrode, wherein an area of the insulation layer covering the power line is provided with at least one opening area, wherein an area of the insulation layer covering the second electrode is provided with at least one opening area, and wherein the temperature sensitive resistor is electrically connected with the power line and second electrode through the opening areas.

4. The circuit structure according to claim 1, wherein an end of the power line closing to the second electrode comprises a third branch and a fourth branch which are disconnected with each other, wherein the third branch is electrically connected with the second electrode, wherein the fourth branch is electrically connected with the voltage source, and wherein the third branch and the fourth branch are connected by the temperature sensitive resistor.

5. An organic light-emitting circuit structure having a temperature compensation function, comprising:
    an organic light-emitting diode comprising: an anode, a cathode, and an organic layer between the anode and the cathode;
    a driving transistor comprising a first electrode and a second electrode, wherein the first electrode is connected with the anode, the second electrode is connected to a voltage source via a power line, the driving transistor is configured to supply a driving current to the organic light-emitting diode based on voltage provided by the voltage source; and
    a temperature sensitive resistor, wherein the temperature sensitive resistor increases a resistance value at sensing a temperature increase or decreases the resistance value at sensing a temperature decrease, wherein a current through the organic light-emitting diode stays compensated and stable; and wherein the first electrode is a source electrode, the second electrode is a drain electrode, or, the first electrode is the drain electrode, the second electrode is the source electrode;
    wherein the organic layer comprises: an organic light-emitting layer between the anode and the cathode, an electron injection layer between the organic light-emitting layer and the cathode, a hole injection layer between the organic light-emitting layer and the anode; an electron transport layer between the electron injection layer and the organic light-emitting layer, and a hole transport layer between the hole injection layer and the organic light-emitting layer;
    wherein the temperature sensitive resistor is disposed between the anode and the hole injection layer and at least partially electrically connected with the anode and the hole injection layer, and wherein the temperature sensitive resistor covers the anode, and is in accordance with a pattern of the anode.

6. The circuit structure according to claim 5, wherein a planarization layer is provided between the driving transistor and the organic light-emitting diode, the anode and the first electrode are connected through a via hole of the planarization layer.

* * * * *